US007372966B2

(12) United States Patent
Bright

(10) Patent No.: US 7,372,966 B2
(45) Date of Patent: May 13, 2008

(54) SYSTEM FOR LIMITING LOUDSPEAKER DISPLACEMENT

(75) Inventor: Andrew Bright, Helsinki (FI)

(73) Assignee: Nokia Corporation (FI)

( * ) Notice: Subject to any disclaimer, the term of this patent is extended or adjusted under 35 U.S.C. 154(b) by 830 days.

(21) Appl. No.: 10/804,858

(22) Filed: Mar. 19, 2004

(65) Prior Publication Data

US 2005/0207584 A1 Sep. 22, 2005

(51) Int. Cl.
*H03G 11/00* (2006.01)
*H03G 3/20* (2006.01)
*H03G 5/00* (2006.01)
*H04R 29/00* (2006.01)

(52) U.S. Cl. ............................ 381/55; 381/56; 381/58; 381/59; 381/98

(58) Field of Classification Search .................. 381/55, 381/56, 58–59, 94.1–3, 94.8–9, 98
See application file for complete search history.

(56) References Cited

U.S. PATENT DOCUMENTS

| | | | | |
|---|---|---|---|---|
| 4,113,983 | A | 9/1978 | Steel | |
| 4,327,250 | A | 4/1982 | von Recklinghausen | |
| 5,481,617 | A | 1/1996 | Bjerre | |
| 5,577,126 | A | 11/1996 | Klippel | |
| 7,184,556 | B1 * | 2/2007 | Johnson et al. | 381/61 |
| 2003/0021427 | A1 | 1/2003 | Nakada et al. | |
| 2004/0136540 | A1 * | 7/2004 | Iwasaki et al. | 381/59 |

FOREIGN PATENT DOCUMENTS

| | | |
|---|---|---|
| EP | 1 135 002 A2 | 9/2001 |
| GB | 2 342 001 A | 8/1999 |
| JP | 60003298 | 1/1985 |
| JP | 10276492 | 10/1998 |
| WO | WO 01/03466 A2 | 1/2001 |

* cited by examiner

*Primary Examiner*—Vivian Chin
*Assistant Examiner*—Douglas Suthers

(57) ABSTRACT

Loudspeakers can be damaged by high drive signals. One reason for this damage is an excess vibration displacement of the coil-diaphragm assembly. This invention describes a novel method for limiting this displacement by a signal processor. In the present invention, a low frequency shelving and notch filter is used to attenuate low frequencies according to a prediction of the loudspeaker displacement. A novel method for calculating coefficient values for a digital implementation of the low frequency shelving and notch filter according to the predicted displacement is described.

30 Claims, 7 Drawing Sheets

SYSTEM FOR LIMITING LOUDSPEAKER DISPLACEMENT

FIELD OF THE INVENTION

This invention generally relates to electro-acoustical transducers (loudspeakers), and more specifically to signal processing for limiting a vibration displacement of a coil-diaphragm assembly in said loudspeakers.

BACKGROUND OF THE INVENTION

1. The Problem Formulation

A signal driving a loudspeaker must remain below a certain limit. If the signal is too high, the loudspeaker will generate nonlinear distortions or will be irreparably damaged. One cause of this nonlinear distortion or damage is an excess vibration displacement of a diaphragm-coil assembly of the loudspeaker. To prevent nonlinear distortion or damage, this displacement must be limited.

Displacement limiting can be implemented by continuously monitoring the displacement by a suitable vibration sensor, and attenuating the input signal if the monitored displacement is larger than the known safe limit. This approach is generally unpractical due to the expensive equipment required for measuring the vibration displacement. Thus some type of a predictive, model-based approach is needed.

2. Prior Art Solutions

The prior art of the displacement limiting can be put into three categories:

1. Variable cut-off frequency filters driven by displacement predictors.
2. Feedback loop attenuators.
3. Multi-frequency band dynamic range controllers.

The prior art in the first category has the longest history. The first such system was disclosed in U.S. Pat. No. 4,113,983, "Input Filtering Apparatus for Loudspeakers", by P. F. Steel. Further refinements were disclosed in U.S. Pat. No. 4,327,250, "Dynamic Speaker Equalizer", by D. R. von Recklinghausen and in U.S. Pat. No. 5,481,617, "Loudspeaker Arrangement with Frequency Dependent Amplitude Regulations" by E. Bjerre. The essence of the prior art in the first category, utilizing a variable high pass filter with a feedback control for said displacement limiting, is shown in FIG. 1*a*.

In this category of loudspeaker protection systems (as shown in FIG. 1*a*), a high-pass filter 12 of a signal processor 10 filters the input electro-acoustical signal 22. Then a filtered output signal 24 of said high-pass filter 12 is sent to a loudspeaker 20 (typically, through a power amplifier 18) and also fed to a feedback displacement predictor block 14. If the value of the displacement exceeds some predefined threshold value, a feedback displacement prediction signal 26 from the block 14 indicated that and a cut-off frequency of the high-pass filter 12 is increased based on the feedback frequency parameter signal 28 provided to the high-pass filter 12 by a feedback parameter calculator 16 in response to said feedback displacement prediction signal 26. By increasing the cut-off frequency of the high-pass filter 12, lower frequencies in the input signal, which generally are the cause of the excess displacement, are attenuated, and the excess displacement is thereby prevented.

The prior art in the first category has several difficulties. The high-pass filter 12 and the feedback displacement predictor block 14 have finite reaction times; these finite reaction times prevent the displacement predictor block 14 from reacting with sufficient speed to fast transients. Bjerre presented a solution to this problem in U.S. Pat. No. 5,481,617 at the expense of significantly complicating the implementation of the displacement limiting system. An additional problem comes from the fact that the acoustic response of the loudspeaker naturally has a high-pass response characteristic: adding an additional high-pass filter in the signal chain in the signal processor 10 increases the order of the low-frequency roll-off. This can be corrected by adding to the signal processor a low-frequency boosting filter after the high-pass filter, as was disclosed by Steel in U.S. Pat. No. 4,113,983. However, this further complicates the implementation of the signal processing.

Prior art in the second category was disclosed in U.S. Pat. No. 5,577,126, "Overload Protection Circuit for Transducers", by W. Klippel. FIG. 1*b* shows the essence of a loudspeaker protection system describing this category. The output of the displacement predictor is fed-back into the input signal, according to a feedback parameter $\kappa$, calculated by a threshold calculator. This category of the vibration displacement protection is simpler than the first category system described above, in that it does not require a separate high-pass filter.

Prior art in the second category can be effective for the vibration displacement limiting. However, the feedback loop has an irregular behaviour around a threshold value, due to a modification of the loudspeaker's Q-factor, and an amplification at low frequencies. These effects can cause subjectively objectionable artifacts. In the above-mentioned U.S. Pat. No. 5,577,126, Klippel describes one solution to this problem: the attenuation of the signal processor is somewhat better behaved if the pure feedback signal path 16 is differentiated, as shown in FIG. 3 of U.S. Pat. No. 5,577,126. However, this causes significant and unnecessary attenuation of the higher frequency band. Therefore, signals that are not responsible for the excess displacement are likely to be attenuated, degrading the performance of the loudspeaker system.

Prior art in the third category was disclosed in WO Patent Application No. PCT/EP00/05962 (International Publication Number WO 01/03466 A2), "Loudspeaker Protection System Having Frequency Band Selective Audio Power Control", by R. Aarts. FIG. 1*c* shows the essence of the third category loudspeaker protection system. The input signal is divided into N frequency bands by a bank of band-pass filters. The signal level in the $n^{th}$ frequency band is modified by a variable gain $g_n$. The signals in the N frequency bands are summed together, and sent to the power amplifier and loudspeaker. An information processor monitors the signal level in each frequency band, as modified by each of the variable gains $g_1, g_2, \ldots g_n$. The information processor modifies the variable gains $g_1, g_2, \ldots g_n$ in such a way as to prevent the excess displacement in the loudspeaker. The advantage of the third category approach is that the signal is attenuated in only that frequency band that is likely to cause the excess loudspeaker diaphragm-coil displacement. The remaining frequency bands are unaffected, thereby minimizing the effects of the displacement limiting on the complete audio signal.

The disadvantage of the third category displacement limiter is that there are no formal rules describing how the information processor should operate. Specifically, no formal methods are available for describing how the information processor should modify the gains $g_n$ so as to prevent the output signal from driving the loudspeaker's diaphragm-coil assembly to the excess displacement. The information processor can only be designed and tuned heuristically, i.e., by a trial-and-error. This generally leads to a long development time and an unpredictable performance.

SUMMARY OF THE INVENTION

The object of the present invention is to provide a novel method of signal processing for limiting a vibration displacement of a coil-diaphragm assembly in electro-acoustical transducers (loudspeakers).

According to a first aspect of the invention, a method for limiting a vibration displacement of an electro-acoustical transducer comprises the steps of: providing an input electro-acoustical signal to a low frequency shelving and notch filter and to a displacement predictor block; generating a displacement prediction signal by said displacement predictor block based on a predetermined criterion in response to said input electro-acoustical signal and providing said displacement prediction signal to a parameter calculator; and generating a parameter signal by said parameter calculator in response to said displacement prediction signal and providing said parameter signal to said low frequency shelving and notch filter for generating an output signal and further providing said output signal to said electro-acoustical transducer thus limiting said vibration displacement.

According further to the first aspect of the invention, the electro-acoustical transducer may be a loudspeaker.

Further according to the first aspect of the invention, the low frequency shelving and notch filter may be a second order filter with a z-domain transfer function given by $$H_c(z) = \sigma_c \frac{1 + b_{1\cdot c}z^{-1} + b_{2\cdot c}z^{-2}}{1 + a_{1\cdot t}z^{-1} + a_{2\cdot t}z^{-2}},$$

wherein $\sigma_c$ is a characteristic sensitivity of the low frequency shelving and notch filter, $b_{1\cdot c}$ and $b_{2\cdot c}$ are feedforward coefficients defining target zero locations, and $a_{1\cdot t}$ and $a_{2\cdot t}$ are feedback coefficients defining target pole locations. Further, said parameter signal may include said characteristic sensitivity $\sigma_c$ and said feedback coefficients $a_{1\cdot t}$ and $a_{2\cdot t}$.

Still further according to the first aspect of the invention, the method may further comprise the step of: generating said output signal by the low frequency shelving and notch filter. Further, the method may further comprise the step of: providing the output signal to said electro-acoustical transducer. Yet further, the output signal may be amplified using a power amplifier prior to providing said output signal to said electro-acoustical transducer.

According further to the first aspect of the invention, the displacement prediction signal may be provided to a peak detector of the parameter calculator. Still further, after the step of generating the displacement prediction signal, the method may further comprise the step of: generating a peak displacement prediction signal by the peak detector and providing said peak displacement prediction signal to a shelving frequency calculator of the parameter calculator. Yet still further, the method may further comprise the step of: generating a shelving frequency signal by the shelving frequency calculator based on a predetermined criterion and providing said shelving frequency signal to a sensitivity and coefficient calculator of the parameter calculator for generating, based on said shelving frequency signal, the parameter signal.

According still further to the first aspect of the invention, the input electro-acoustical signal may be a digital signal.

According further still to the first aspect of the invention, said low frequency shelving and notch filter may be a second order filter with an s-domain transfer function given by $$H_c(s) = \frac{s^2 + s\omega_c / Q_c + \omega_c^2}{s^2 + s\omega_t / Q_t + \omega_t^2},$$

wherein $Q_c$ is a coefficient corresponding to a Q-factor of the electro-acoustical transducer, $\omega_c$ is a resonance frequency of the electro-acoustical transducer mounted in an enclosure, $Q_t$ is a coefficient corresponding to a target equalized Q-factor, $\omega_t$ is a target equalized cut-off frequency. Still further, $Q_c$ may be equal to $1/\sqrt{2}$, when the electro-acoustical transducer is critically damped. Yet further, $Q_c$ may be a finite number larger than $1/\sqrt{2}$, when the electro-acoustical transducer is under-damped.

According to a second aspect of the invention, a computer program product comprising: a computer readable storage structure embodying computer program code thereon for execution by a computer processor with said computer program code, characterized in that it includes instructions for performing the steps of the first aspect of the invention indicated as being performed by the displacement predictor block or by the parameter calculator or by both the displacement predictor block and the parameter calculator.

According to a third aspect of the invention, a signal processor for limiting a vibration displacement of an electro-acoustical transducer comprises: a low frequency shelving and notch filter, responsive to an input electro-acoustical signal and to a parameter signal, for providing an output signal to said loudspeaker thus limiting said vibration displacement of said electro-acoustical transducer; a displacement predictor block, responsive to said input electro-acoustical signal, for providing a displacement prediction signal; and a parameter calculator, responsive to said displacement prediction signal, for providing the parameter signal.

According further to the third aspect of the invention, the parameter calculator block may comprise: a peak detector, responsive to the displacement prediction signal, for providing a peak displacement prediction signal; a shelving frequency calculator, responsive to the peak displacement prediction signal; for providing a shelving frequency signal; and a sensitivity and coefficient calculator, responsive to said shelving frequency signal, for providing the parameter signal. Further still, said low frequency shelving and notch filter may be a second order digital filter with a z-domain transfer function given by $$H_c(z) = \sigma_c \frac{1 + b_{1\cdot c}z^{-1} + b_{2\cdot c}z^{-2}}{1 + a_{1\cdot t}z^{-1} + a_{2\cdot t}z^{-2}},$$

wherein $\sigma_c$ is a characteristic sensitivity of the low frequency shelving and notch filter, $b_{1\cdot c}$ and $b_{2\cdot c}$ are feedforward coefficients defining target zero locations, and $a_{1\cdot t}$ and $a_{2\cdot t}$ are feedback coefficients defining target pole locations. Yet further, said parameter signal may include said characteristic sensitivity $\sigma_c$ and said feedback coefficients $a_{1\cdot t}$ and $a_{2\cdot t}$.

Further according to the third aspect of the invention, the output signal may be provided to said electro-acoustical transducer or said the output signal is amplified using a power amplifier prior to providing said output signal to said electro-acoustical transducer.

Still further according to the third aspect of the invention, the input electro-acoustical signal may be a digital signal.

According further to the third aspect of the invention, the low frequency shelving and notch filter may be a second order filter with an s-domain transfer function given by $$H_c(s) = \frac{s^2 + s\omega_c / Q_c + \omega_c^2}{s^2 + s\omega_t / Q_t + \omega_t^2},$$

wherein $Q_c$ is a coefficient corresponding to a Q-factor of the electro-acoustical transducer, $\omega_c$ is a resonance frequency of the electro-acoustical transducer mounted in an enclosure, $Q_t$ is a coefficient corresponding to a target equalized Q-factor, $\omega_t$ is a target equalized cut-off frequency. Further, $Q_c$ may be equal to $1/\sqrt{2}$, when the electro-acoustical transducer is critically damped. Yet still further, $Q_c$ may be a finite number larger than $1/\sqrt{2}$, when the electro-acoustical transducer is under-damped.

According still further to the third aspect of the invention, the electro-acoustical transducer may be a loudspeaker.

BRIEF DESCRIPTION OF THE DRAWINGS

For a better understanding of the nature and objects of the present invention, reference is made to the following detailed description taken in conjunction with the following drawings, in which.

BEST MODE FOR CARRYING OUT THE INVENTION

The present invention provides a novel method for signal processing limiting and controlling a vibration displacement of a coil-diaphragm assembly in electro-acoustical transducers (loudspeakers). The electro-acoustical transducers are devices for converting an electrical or digital audio signal into an acoustical signal. For example, the invention relates specifically to a moving coil of the loudspeakers.

The problems of the prior art methods described above for the displacement limiting is solved by starting with the first category approach, and making the following modifications:

- Replacing the variable high-pass filter 12 (see FIG. 1*a*) with a variable low-frequency shelving and notch (LFSN) filter;
- Using a feedforward instead of a feedback control of the filter 12 by the displacement predictor block;
- Employing a digital implementation;
- Approximating the exact formulas for calculating required coefficients by finite polynomial series.

According to the present invention, a signal processor with the above characteristics or a combination of some of these characteristics provides a straightforward and efficient system for said displacement limiting. Large signals that can drive the loudspeaker into an excess displacement are attenuated at low frequencies. Higher-frequency signals that do not overdrive the loudspeaker can be simultaneously reproduced unaffected. The behaviour of the limiting system can be known from its base operating parameters, and can therefore be tuned based on the known properties of the loudspeaker.

FIG. 2 shows one example among others of a signal processor with a loudspeaker arrangement utilizing a low-frequency shelving and notch (LFSN) filter 11 driven by a feedforward control using a displacement predictor block 14*a* for limiting a vibration displacement of an electro-acoustical transducer (loudspeaker) 20, according to the present invention. The limiting of the vibration displacement is achieved by modifying a transfer function of the LFSN filter 11 based on the output of the displacement predictor block 14*a*.

Figure 1A:
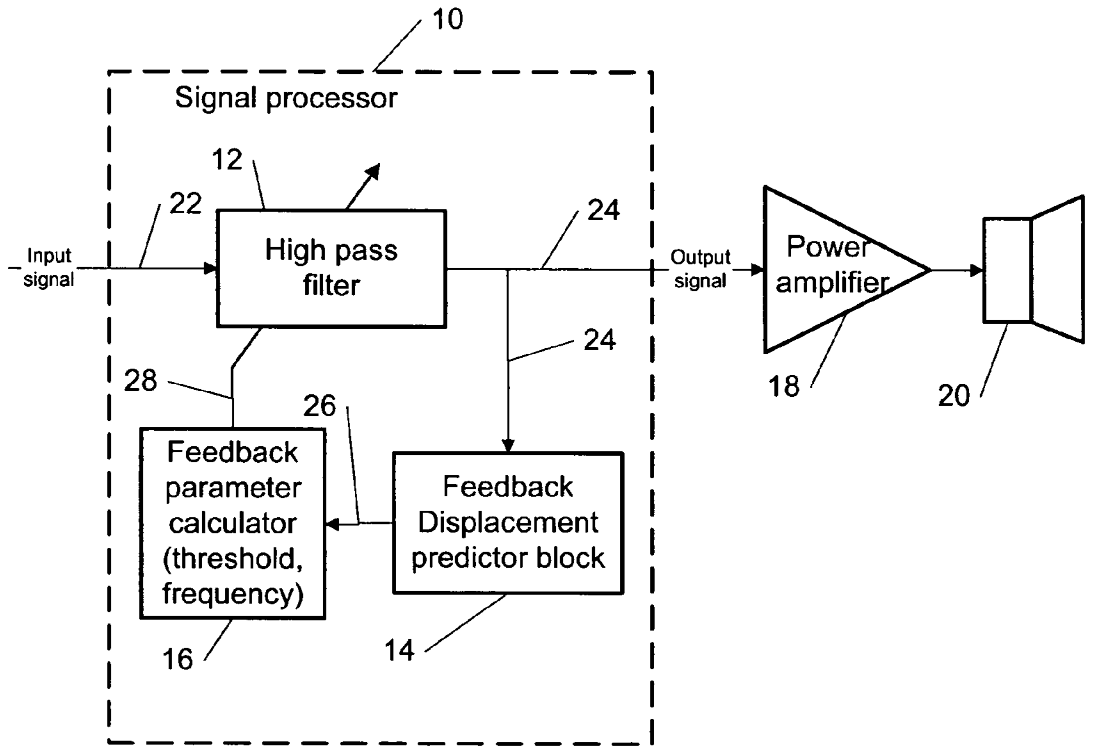
Figure 1a PRIOR ART
FIGS. 1*a*, 1*b* and 1*c* show examples of a signal processor and a loudspeaker arrangement for a first, second and third category signal processing systems for a loudspeaker protection (vibration displacement limiting), respectively, according to the prior art.
Figure 1B:
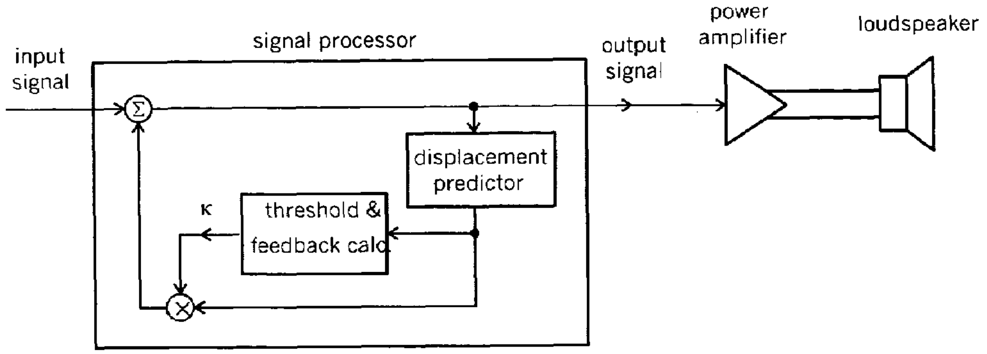
Figure 1b PRIOR ART
Figure 1C:
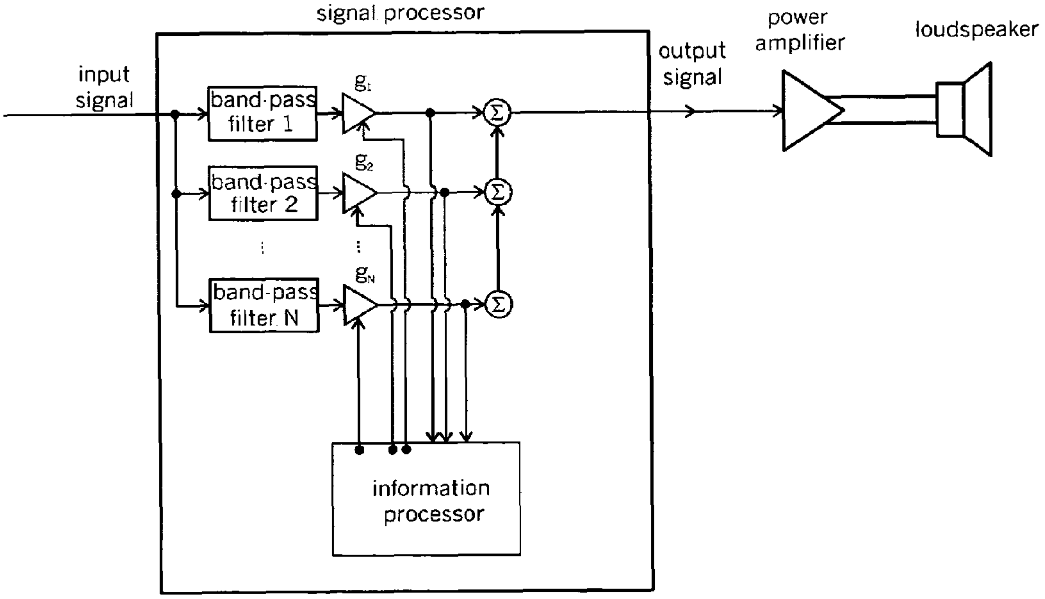
Figure 1c PRIOR ART

As in FIG. 1*a*, the LFSN filter 11 of a signal processor 10*a* filters the input electro-acoustical signal 22. Said input electro-acoustical signal 22 can be a digital signal, according to the present invention. Then a filtered output signal 24*a* of the LFSN filter 11 is sent to a loudspeaker 20 (typically, through a power amplifier 18). But, according to the present invention, the input electro-acoustical signal 22 is also fed to a displacement predictor block 14*a*. If the value of the vibration displacement exceeds a predefined threshold value (that is a predetermined criterion), a displacement prediction signal 26*a* from the block 14*a* is generated and provided to the parameter calculator 16*a* which generates a parameter signal 28*a* in response to that signal 26*a* and then said parameter signal 28*a* is provided to the LFSN filter 11. Based on said parameter signal 28*a*, the transfer function of said LFSN filter 11 is modified appropriately and the output signal 24*a* of said LFSN filter 11 has the vibration displacement component attenuated based on said predetermined criterion.

The LFSN filter 11 attenuates only low frequencies, which are the dominant sources of a large vibration displacement. The diaphragm-coil displacement can be predicted from the input signal 22 by the displacement predictor block 14*a* implemented as a digital filter. Generally, the required order of said digital filter is twice that of the number of mechanical degrees of freedom in the loudspeaker 20. The output of this filter is the instantaneous displacement of the diaphragm-coil assembly of the loudspeaker 20. The performance of the displacement predictor block 14*a* is known in the art and is, e.g., equivalent to the performance of the part 9 shown in FIG. 2 of U.S. Pat. No. 4,327,250, "Dynamic Speaker Equalizer", by D. R. von Recklinghausen. Detailed description of the parameter calculator 16 is shown in an example of FIG. 2*b* and discussed in detail later in the text.

Figure 3:
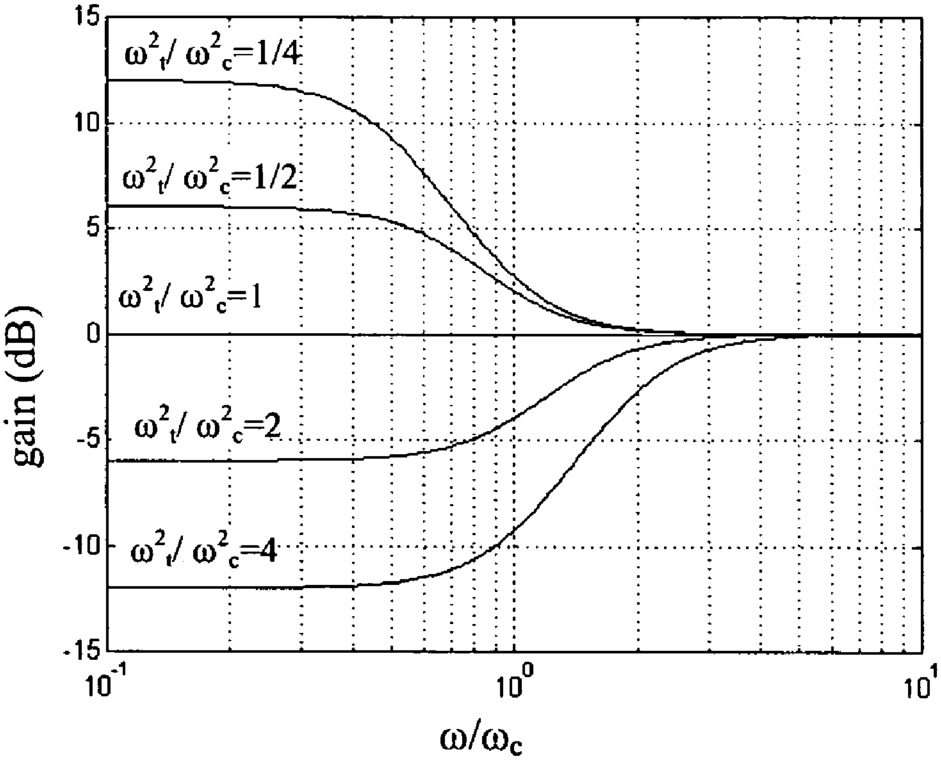
FIG. 3 shows an example of response curves of a low-frequency shelving and notch filter (without a notch and $Q_c$=0.707) for a critically damped loudspeaker, according to the present invention.

The LFSN filter 11 can be designed, according to the present invention, as a second-order filter with an s-domain transfer function given by $$H_c(s) = \frac{s^2 + s\omega_c/Q_c + \omega_c^2}{s^2 + s\omega_t/Q_t + \omega_t^2}, \tag{1}$$

wherein $Q_c$ is a coefficient corresponding to a Q-factor (of the loudspeaker 20), $\omega_c$ is a resonance frequency of a loudspeaker 20 mounted in a cabinet (enclosure), in rad/s, $Q_t$ is a coefficient corresponding to a target equalized Q-factor, $\omega_t$ is a target equalized cut-off frequency (shelving frequency), in rad/s. The magnitude of the frequency response of the filter 11, a low-frequency gain, equals to $\omega_c^2/\omega_t^2$. Typical gain curves for this low-frequency shelving and notch filter 11 with $Q_c=Q_t=1/\sqrt{2}$ (the loudspeaker 20 is critically damped and the LFSN filter 11 does not have a notch) are shown in FIG. 3 for five values of $\omega_t^2/\omega_c^2$ ratio. The ability of the LFSN filter 11 to limit the displacement is made clear in FIG. 4*a*.

Figure 4A:
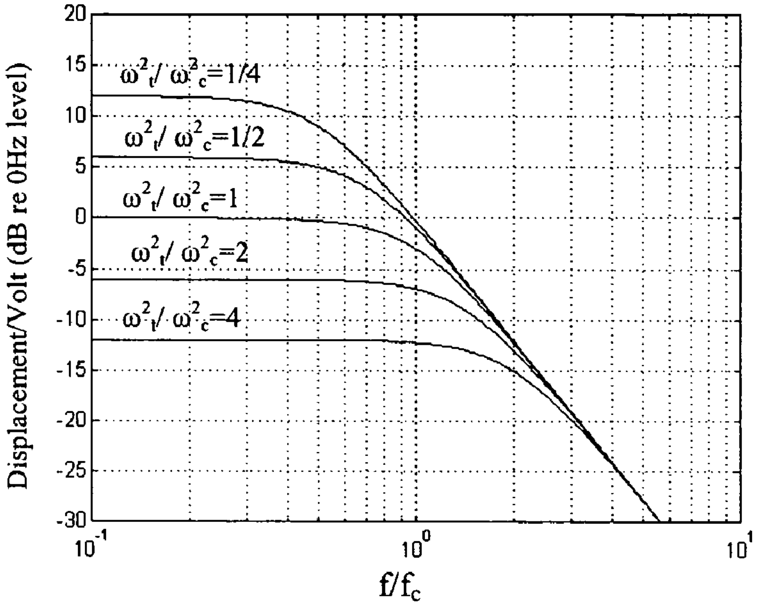
FIGS. 4*a* and 4*b* show examples of displacement response curves for a loudspeaker which is critically damped and under-damped, respectively, by utilizing a low-frequency shelving and notch filter of FIG. 3, according to the present invention.

FIG. 4*a* shows an example among others of displacement response curves for the loudspeaker 20, which is critically damped by utilizing the LFSN filter 11 of FIG. 3, according to the present invention. As the value of $\omega_t$ is increased, the displacement response is attenuated as seen in FIG. 4*a*. In the low frequency limit, the amount of attenuation varies as $\omega_t^2$. The mathematical detail behind this is discussed below. These displacement response curves are for a "critically damped" loudspeaker, i.e., one tuned to a Butterworth alignment ($Q_c=Q_t=1/\sqrt{2}$).

Figure 4B:
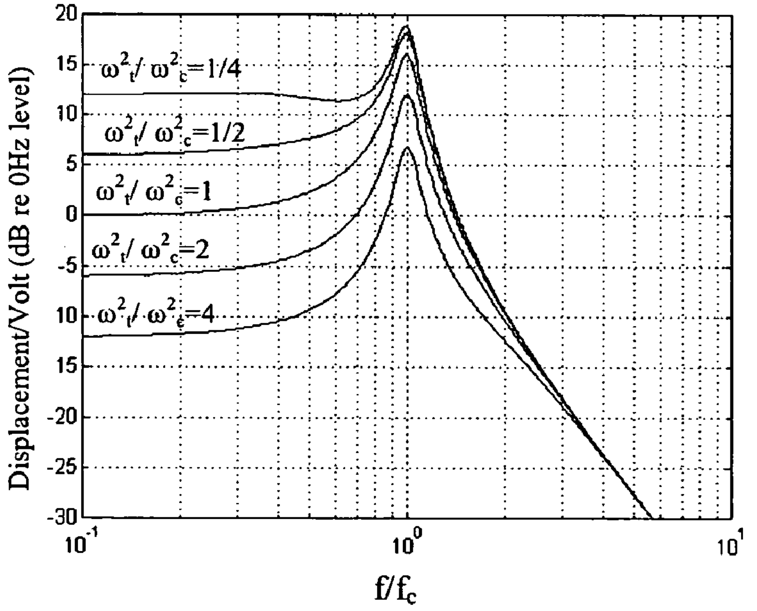
Figure 5A:
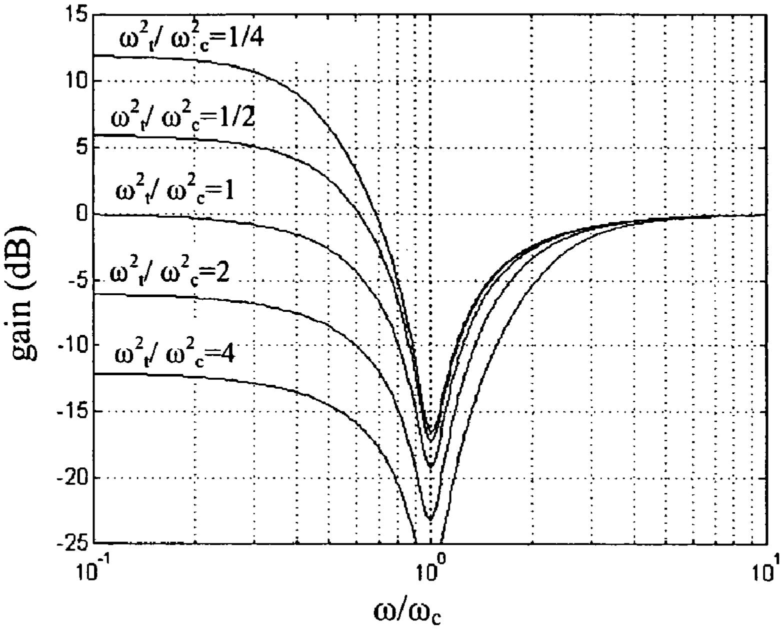
FIG. 5*a* shows an example of response curves of a low-frequency shelving and notch filter (with a notch and $Q_c$=6.4) for an under-damped loudspeaker, according to the present invention.

Inexpensive loudspeakers often have an under-damped response, i.e., having values of $Q_c$ and $Q_t$ greater than $1/\sqrt{2}$. FIG. 4*b* shows an example of displacement response curves for the loudspeaker 20 which is under-damped, by utilizing the LFSN filter 11 of FIG. 3, according to the present invention. The higher $Q_c$ and $Q_t$ values of the loudspeaker 20 make the relationship between the reduction in the displacement response and the increase in $\omega_t$ less straightforward, particularly near the resonance frequency $\omega_c$. To solve this problem, the value of $Q_c$ may be "artificially" decreased. This is done by setting the value of $Q_c$ in Equation 1 to the value of $Q_c \approx 6.4$ (instead of $1/\sqrt{2}$). FIG. 5*a* shows an example among others of response curves of the low-frequency shelving and notch filter 11 (with a notch at $\omega_c$ by setting $Q_c=6.4$) for an under-damped loudspeaker 20, according to the present invention. As can be seen from FIG. 5*a*, the resulting response has a notch at the resonance frequency $\omega_c$, which comes from setting the numerator Q-factor in Equation 1 to a value higher than $1/\sqrt{2}$. For this reason, the filter 11 is referred to as the low frequency shelving and notch (LFSN) filter.

Figure 5B:
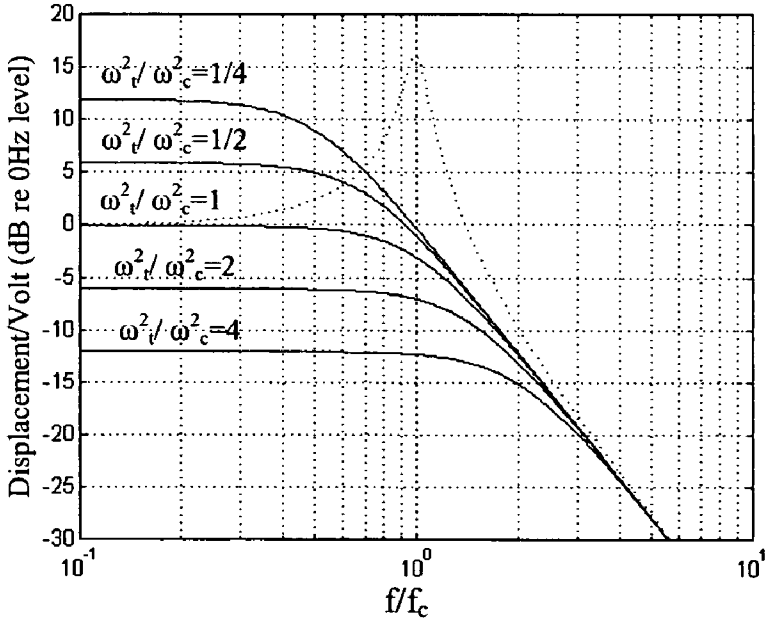
FIG. 5*b* shows an example of displacement response curves for a loudspeaker which is under-damped by utilizing a low-frequency shelving and notch filter of FIG. 5*a*, according to the present invention.

The effect of the LFSN filter 11 on the displacement response of the under-damped loudspeaker 20 is demonstrated in FIG. 5*b*. The broken line shows the loudspeaker's displacement response without the LFSN filter.

The transfer function describing the ratio of the vibration displacement to the input signal 22 is a product of the LFSN filter 11 response (transfer function) and the loudspeaker 20 displacement response. This is an equalized displacement response in the s-domain given by $$\begin{aligned} H_{DP\text{-}E}(s) &= H_c(s)X_{m\cdot v_c}(s) \\ &= \frac{\phi_0}{m_t R_{eb}} \frac{s^2 + s\omega_c/Q_c + \omega_c^2}{s^2 + s\omega_t/Q_t + \omega_t^2} \frac{1}{s^2 + s\omega_c/Q_c + \omega_c^2}, \end{aligned} \tag{2}$$

which reduces to $$H_{DP\text{-}E}(s) = \frac{\phi_0}{m_t R_{eb}} \frac{1}{s^2 + s\omega_t/Q_t + \omega_t^2}, \tag{3}$$

wherein $\phi_0$ is a loudspeaker's transduction coefficient (B•1 factor), $R_{eb}$ is a DC-resistance of the voice coil of the loudspeaker 20 and $m_t$ is a total moving mass.

Figure 2A:
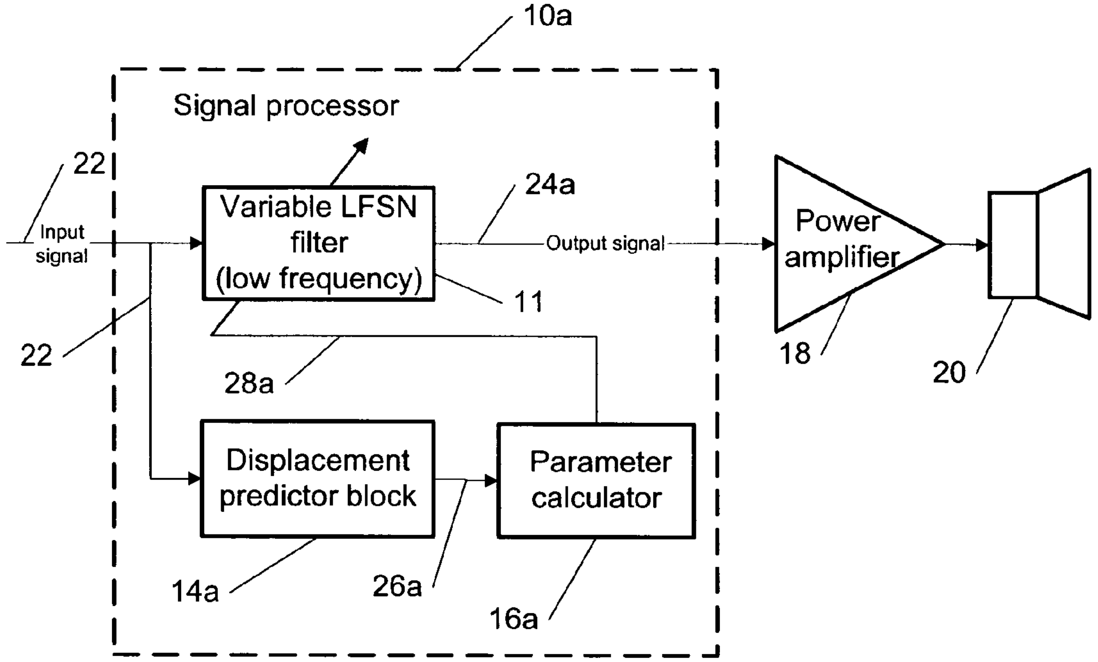
FIG. 2*a* shows an example of a signal processor with a loudspeaker arrangement utilizing a variable low-frequency shelving and notch filter driven by a feedforward control using a displacement predictor block, according to the present invention.

The reduction of Equation 2 to Equation 3 is an important result for operating the displacement predictor block 14*a* of FIG. 2*a*. The input to the displacement predictor block 14*a* is the input signal 22, not the output signal 24*a* from the LFSN filter 11 (as in the prior art, see FIG. 1*a*). Thus the displacement predictor block 14*a* must account for the effect of the LFSN filter 11. It would at first seem that the displacement predictor would need to account for the second-order system described by the loudspeaker displacement response $X_{m\cdot v_c}(s)$ and the second order LFSN filter 11, resulting in a fourth-order system altogether. However, the reduction of Equation 2 to the single second-order transfer function described by Equation 3 shows that the displacement predictor block 14*a* needs only be a second-order system.

The same reduction can be made for the z-domain transfer function describing a digital processing implementation of the equalized displacement response. The product between the z-domain transfer functions of the digital processing version of the LFSN filter 11 and a digital model of the loudspeaker 20 displacement is given by $$H_{DP\text{-}E}(z) = \sigma_c \sigma_{x\cdot v_c} \frac{1 + b_{1\cdot c}z^{-1} + b_{2\cdot c}z^{-2}}{1 + a_{1\cdot t}z^{-1} + a_{2\cdot t}z^{-2}} \frac{z^{-1}}{1 + a_{1\cdot c}z^{-1} + a_{2\cdot c}z^{-2}}, \tag{4}$$

wherein $\sigma_c$ is a characteristic sensitivity of the LFSN filter, $\sigma x \cdot v_c$ is a characteristic sensitivity of the digital displacement predictor block 14*a*, $b_{1\cdot c}$ and $b_{2\cdot c}$ are feedforward coefficients defining the target zero locations, $a_{1\cdot t}$ and $a_{2\cdot t}$ are feedback coefficients defining the target pole locations and $a_{1\cdot c}$ and $a_{2\cdot c}$ are feedback coefficients defining the loudspeaker's pole locations.

It is noted that the coefficients $b_{1\cdot c}$ and $b_{2\cdot c}$ can have the same values as $a_{1\cdot c}$ and $a_{2\cdot c}$, respectively. Therefore Equation 4 reduces to $$H_{DP\text{-}E}(z) = \sigma_c \sigma_{x\cdot v_c} \frac{z^{-1}}{1 + a_{1\cdot t} z^{-1} + a_{2\cdot t} z^{-2}}. \quad (5)$$

The Equation 5 can be written with a single characteristic sensitivity by defining $$\sigma_{dp\_m} = \sigma_c \sigma_{x\text{-}v_c} \quad (6),$$

wherein $\sigma_{dp\_m}$ is the metrically correct characteristic sensitivity, given by $$\sigma_{\text{dp\_m}} = \frac{a_g \phi_0}{R_{eb} k_t} (1 + a_{1\cdot c} + a_{2\cdot c}) \frac{1 - a_{1\cdot t} + a_{2\cdot t}}{1 - b_{1\cdot c} + b_{2\cdot c}}, \quad (7)$$

wherein $a_g$ is a gain of the power amplifier 18 and D/A converter (not shown in FIG. 2*a* but used in a case of the digital implementation) and $k_t$ is a total stiffness of the loudspeaker 20 suspension (loudspeaker's suspension stiffness) including acoustic loading from any enclosure.

The LFSN filter 11 achieves limiting the vibration displacement by increasing the frequency $\omega_t$. As shown in FIGS. 3 and 5*a*, increasing this frequency $\omega_t$ reduces the gain at lower frequencies, and leaves it unchanged at higher frequencies. This provides the desired limiting effect, by changing the displacement response as shown in FIGS. 4*a* and 5*b*.

Figure 2B:
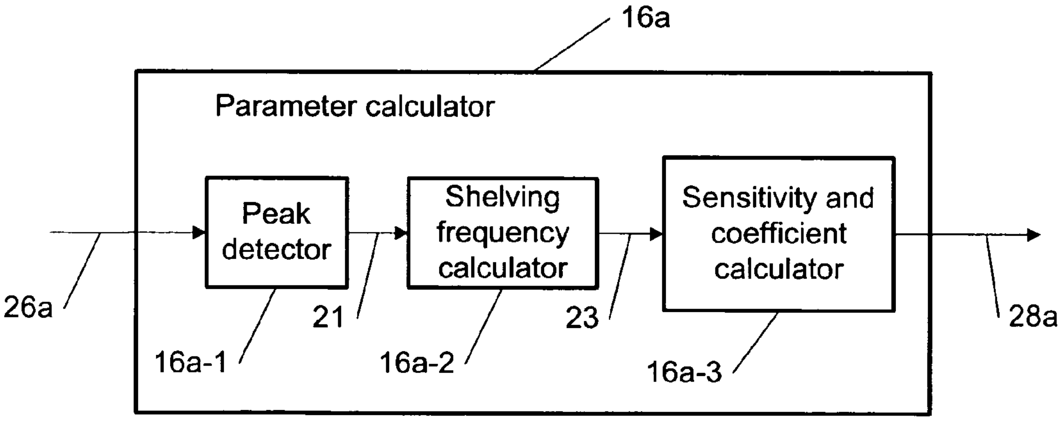
FIG. 2*b* shows an example of a parameter calculator used in the example of FIG. 2*a*, according to the present invention.

The displacement-limiting algorithm is shown in more detail in FIG. 2*b*. A peak detector 16*a*-1, in response to the displacement prediction signal 26*a* from the displacement predictor block 14*a*, provides a peak displacement prediction signal 21 to a shelving frequency calculator 16*a*-2. The peak detector provides an absolute value of the displacement. It also provides a limited release time (decay rate) for the displacement estimate.

As discussed above, at low frequencies, the gain of the filter varies according to the square of the shelving frequency. Due to the nature of the displacement response of the loudspeaker 20, it is assumed that the signals that are responsible for the excess displacement are at the low frequencies. With this assumption, the required shelving frequency is calculated from the excess displacement as follows:

$$\begin{aligned} &\text{if } (x_{pn}[n] > x_{lm}) \\ &f_r = f_t \sqrt{1 + \frac{x_{pn}[n] - x_{lm}}{x_{lm}}} \quad \text{else} \\ &f_r = f_t, \end{aligned} \quad (8)$$

wherein $f_r$ is a shelving frequency required to limit the displacement, $f_t$ is a target cut-off frequency, $x_{lm}$ and $x_{pn}[n]$ is a displacement predicted by the displacement predictor block 14*a* and normalized to a maximum possible displacement $x_{mp}$.

The maximum possible displacement $x_{mp}$ can be determined from an analysis of the displacement predictor block 20. It can be calculated as $$x_{mp} = \frac{g_{RX} \phi_0 F(Q_c)}{k_t R_{eb}}, \quad (8a)$$

wherein $g_{RX}$ is a maximum possible voltage that the D/A and power-amplifier (the D/A conversion is used for the digital implementation) can create, and $F(Q_c)$ is a function of the loudspeaker's Q-factor, given by $$F(Q_c) = \begin{cases} 1 & Q_c \le 1/\sqrt{2} \\ \dfrac{1}{\sqrt{\dfrac{1}{Q_c^2} - \dfrac{1}{4Q_c^4}}} & Q_c > 1/\sqrt{2} \end{cases}. \quad (8b)$$

The peak value is determined according to $$\begin{aligned} &\text{if } (|x_{in}[n]| > x_{pn}[n-1]) \\ &x_{pn}[n] = |x_{in}[n]| \text{ else} \\ &x_{pn}[n] = t_r\, x_{pn}[n-1], \end{aligned} \quad (8c)$$

wherein $x_{in}[n]$ is an instantaneous unity-normalized predicted displacement, $x_{pn}[n]$ is a peak-value of the unity-normalized predicted displacement, and $t_r$ is a release time constant. The release time constant $t_r$ is calculated from the specified release rate d in dB/s, according to $$t_r = 10^{-d/20F_s} \quad (8d),$$

wherein $F_s$ is a sample rate.

The required shelving frequency $f_r$ is given by the algorithm of Equation 8. If the predicted displacement is above the displacement limit (according to a predetermined criterion), this required shelving frequency is increased from the target shelving frequency $f_t$ according to the first expression of Equation 8. Otherwise (if the predicted displacement is below said limit), the required shelving frequency remains the target shelving frequency (see Equation 8). If the required shelving frequency changes, new values for the coefficients $a_{1\text{-}t}$, $a_{2\text{-}t}$, and $\sigma_c$ need to be calculated by a sensitivity and coefficient calculator 16*a*-3, thus providing said parameter signal 28*a* to the variable LFSN filter 11. In theory, these parameters could be calculated by formulas for digital filter alignments. However, these methods are generally unsuitable for a real-time, fixed-point calculation. Methods for calculating these coefficients with polynomial approximations suitable for the fixed-point calculation are presented below.

An initial simplification can be made for the $f_r$ calculation using Equation 8 by defining $x_{lmg}$, the inverse of the scaled displacement limit, as $$x_{lmg} = 1/x_{lm} \quad (9).$$

This value, $x_{lmg}$, is the maximum attenuation needed for the displacement limiting. Substituting $x_{lmg}$ into the first expression of Equation 8 results in the following expression for calculating $f_r$:

$$f_r = f_t \sqrt{x_{lmg}} \sqrt{x_{pn}[n]} \quad (10).$$

This value of $f_r$ is used to calculate $\omega_{r\text{-}z}$, a frequency required for the displacement limiting, in rad/s, normalized to sampling rate as follows $$\omega_{r\cdot z} = \frac{2\pi}{F_s} f_r, \tag{11}$$

wherein $F_s$ is a sampling rate.

Combining Equations 10 and 11 results in $$\omega_{r\cdot z} = \frac{2\pi}{F_s} f_t \sqrt{x_{lmg}} \sqrt{x_{pn}[n]}. \tag{12}$$

By defining $\omega_{t\cdot z}$ in terms of $f_t$ as in Equations 11 and 12 reduces it to $$\omega_{r\cdot z}=\sqrt{\omega_{t\cdot z}^2 x_{lmg} x_{pn}[n]} \quad (13).$$

From this value of $\omega_{r\cdot z}$, new values of $a_{1\cdot r}$ and $a_{2\cdot r}$ can be calculated as follows $$a_{1\cdot r}=-2e^{-\omega_{r\cdot z}\zeta_r}\cos(\omega_{r\cdot z}\sqrt{1-\zeta_r^2})$$

$$a_{2\cdot r}=e^{-2\omega_{r\cdot z}\zeta_r} \quad (14),$$

wherein $\zeta_r$ is a damping ratio.

The coefficients $a_{1\cdot r}$ and $a_{2\cdot r}$ can be calculated directly from $x_{pn}[n]$, defined as a displacement normalized to the maximum possible displacement ($x_{mp}$) at a time sample n, by combining Equations 10 through 14. Furthermore, these coefficients can be approximated by these polynomial series in $x_{pn}[n]$.

$$\hat{a}_{1\cdot r}(x_{pn}[n])=p_{a_1\cdot 0}+p_{a_1\cdot 1}x_{pn}[n]+p_{a_1\cdot 2}x_{pn}^2[n]+p_{a_1\cdot 3}x_{pn}^3[n]+p_{a_1\cdot 4}x_{pn}^4[n] \tag{15}$$

and $$\hat{a}_{2\cdot r}(x_{pn}[n])=p_{a_2\cdot 0}+p_{a_2\cdot 1}x_{pn}[n]+p_{a_2\cdot 2}x_{pn}^2[n]p_{a_2\cdot 3}x_{pn}^3[n]+p_{a_2\cdot 4}x_{pn}^4[n] \quad (16).$$

The characteristic sensitivity $\sigma_c$ can be calculated from $\hat{a}_{1\cdot r}$ and $\hat{a}_{2\cdot r}$ according to $$\sigma_c=b_d(1-a_{1\cdot r}+a_{2\cdot r}) \quad (17),$$

wherein $$b_d = \frac{1}{1-b_{1\cdot c}+b_{2\cdot c}}$$

The variables $b_{1\cdot c}$ and $b_{2\cdot c}$ are known from the properties of the loudspeaker 20.

As $b_{1\cdot c}$ and $b_{2\cdot c}$ change only with the loudspeaker 20 characteristics, and thus change only infrequently, it is more efficient to compute $b_d$, and store this in a memory for calculating $\sigma_c$. Therefore, according to the present invention, the value of $b_d$ can to be calculated only once (and not continuously in the real-time), The complete formulas for $a_{1\cdot r}$ and $a_{2\cdot r}$ are difficult to approximate with short polynomial series for the full range of theoretically valid values of $\omega_{r\cdot z}$ with an adequate accuracy. Potentially, the approximation accuracy can be improved by increasing the order of the polynomial series. This has not been found to be feasible, because it not only increases significantly the complexity of the calculation, it also leads to coefficients to be poorly scaled, making them unsuitable for the fixed-point calculation.

The solution to this problem is to optimize the accuracy of the polynomial coefficients which can mean that different polynomial coefficients will have to be used for different hardware and sampling rates, as the latter can be known for a given product, so such coefficients can be stored in that product's fixed ROM.

Using $x_{pn}[n]$ as the input to the polynomial approximation has an additional advantage. Since all of $x_{pn}$, $a_{1\cdot r}/2$, $a_{2\cdot r}$, and $\sigma_c$ are limited to the range (0, 1), the values of the polynomial coefficients in the polynomial approximation will be better scaled than if, e.g., the required cut-off frequency is used as the input to the polynomial approximation Using said $x_{pn}[n]$ simplifies implementation of the polynomial approximation using a fixed-point digital signal processor. Therefore, the polynomial series can be a good approximation for calculating $a_{1\cdot r}$ and $a_{2\cdot r}$ from $x_{pn}$:

$$a_{1\cdot r}/2 = -e^{-\zeta\pi\sqrt{a_f x_{pn}}}\cos\left(\pi\sqrt{a_f x_{pn}}\sqrt{1-\zeta_r^2}\right) \tag{19}$$

$$a_{2\cdot r} = e^{-2\zeta_r\pi\sqrt{a_f x_{pn}}},$$

wherein $a_f$ is given by $$a_f = \frac{1}{\pi^2}\omega_{t\cdot z}^2 x_{lmg}, \tag{20}$$

and wherein the range of possible values of $x_{pn}$ is $$x_{pn}\in(x_{lm}, 1) \quad (21).$$

This corresponds to a possible range of values of $\omega_{r\cdot z}$ of $$\omega_{r\cdot z}\in(\omega_{t\cdot z}, \omega_{t\cdot z}\sqrt{x_{lmg}}) \quad (22).$$

The Equations 7 through 22 illustrate only a few examples among many other possible scenarios for calculating a characteristic sensitivity, $a_{1\cdot r}$ and $a_{2\cdot r}$ by the parameter calculator 16*a*.

Figure 6:
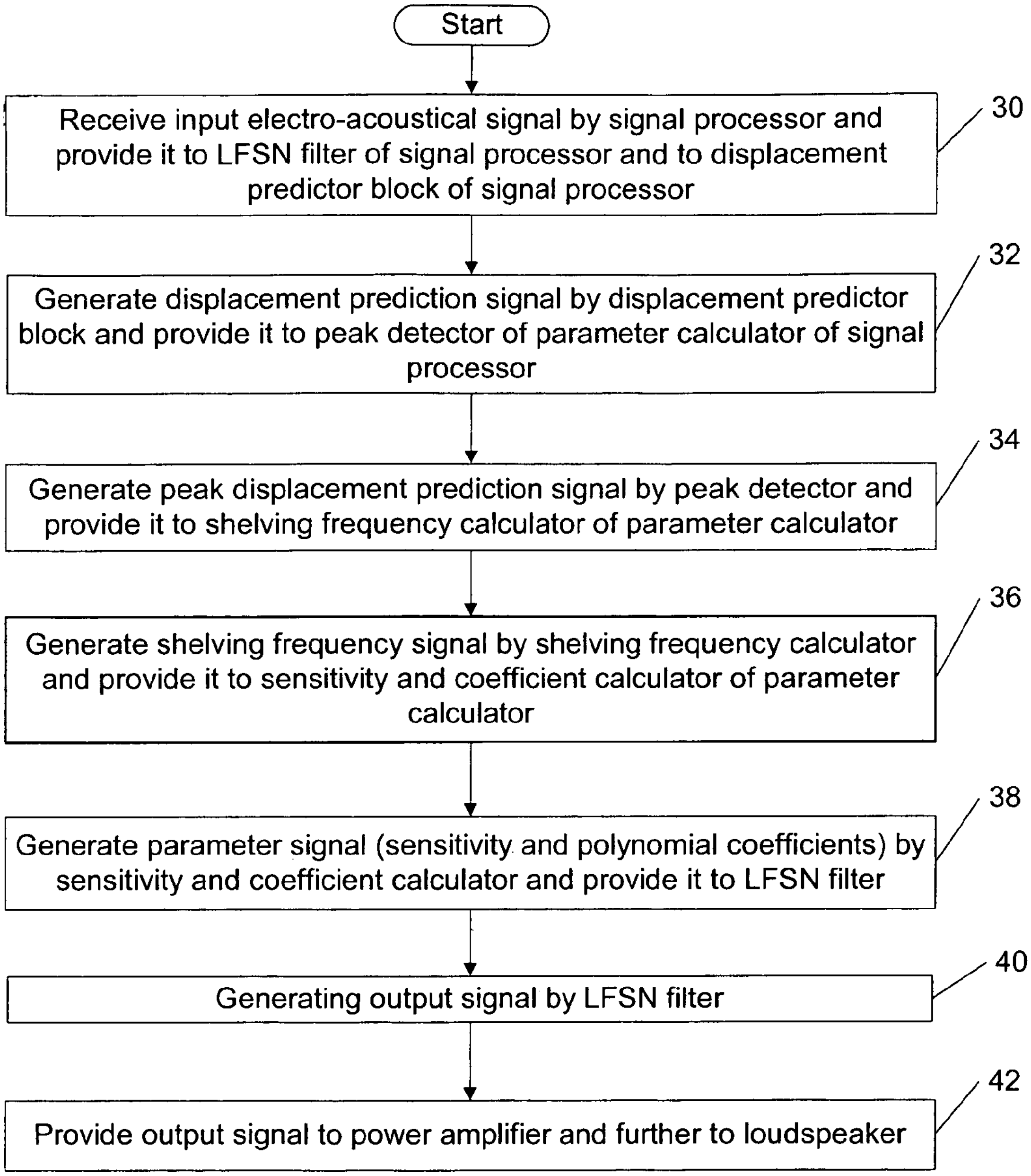
FIG. 6 is a flow chart demonstrating a performance of a signal processor with a loudspeaker arrangement utilizing a variable low-frequency shelving and notch filter driven by a feedforward control using a displacement predictor block, according to the present invention.

Finally, FIG. 6 is a flow chart demonstrating a performance of a signal processor with a loudspeaker arrangement utilizing a variable low-frequency shelving and notch filter 11 driven by a feedforward control using a displacement predictor block 14*a* for limiting a vibration displacement of an electro-acoustical transducer (loudspeaker) 20, according to the present invention.

The flow chart of FIG. 6 only represents one possible scenario among many others. In a method according to the present invention, in a first step 30, the input electro-acoustical signal 22 is received by the signal processor 10*a* and provided to the LFSN filter 11 of said signal processor 10 and to the displacement predictor block 14*a* of said signal processor 10. In a next step 32, the displacement predictor block 14*a* generates the displacement prediction signal 26*a* and provides said signal 26*a* to the peak detector 16*a*-1 of the parameter calculator 16*a* of said signal processor 10. In a next step 34, the peak displacement prediction signal 23 is generated by the peak detector 16*a*-1 and provided to the shelving frequency calculator 16*a*-2 of said parameter calculator 16*a*. In a next step 36, the shelving frequency signal 23 is generated by the shelving frequency calculator 16*a*-2 and provided to the sensitivity and coefficient calculator 16*a*-3 of the parameter calculator 16*a*. In a next step 38, the parameter signal 28*a* (e.g., which includes the characteristic sensitivity and polynomial coefficients) is generated by the sensitivity and coefficient calculator 16*a*-3 and provided it to the LFSN filter 11. In a next step 40, the output signal 24*a* is generated by the LFSN filter 11. Finally, in a last step 42, the output signal 24*a* is provided to the power amplifier 18 and further to the loudspeaker 20.

As explained above, the invention provides both a method and corresponding equipment consisting of various modules providing the functionality for performing the steps of the method. The modules may be implemented as hardware, or may be implemented as software or firmware for execution by a processor. In particular, in the case of firmware or software, the invention can be provided as a computer program product including a computer readable storage structure embodying computer program code, i.e., the software or firmware thereon for execution by a computer processor (e.g., provided with the displacement predictor block 14*a* or with the parameter calculator 16*a* or with both the displacement predictor block 14*a* and the parameter calculator 16*a*).

What is claimed is:

1. A method, comprising:

providing an input electro-acoustical signal to a low frequency shelving and notch filter and to a displacement predictor block;

generating a displacement prediction signal by said displacement predictor block based on a predetermined criterion in response to said input electro-acoustical signal and providing said displacement prediction signal to a parameter calculator; and generating a parameter signal by said parameter calculator in response to said displacement prediction signal and providing said parameter signal to said low frequency shelving and notch filter for generating an output signal and further providing said output signal to an electro-acoustical transducer for limiting a vibration displacement, wherein said parameter signal is determined using a shelving frequency required for providing said limiting of said vibration displacement.

2. The method of claim 1, wherein said electro-acoustical transducer is a loudspeaker.

3. The method of claim 1, wherein said low frequency shelving and notch filter is a second order filter with a z-domain transfer function given by $$H_c(z) = \sigma_c \frac{1 + b_{1\text{-}c} z^{-1} + b_{2\text{-}c} z^{-2}}{1 + a_{1\text{-}t} z^{-1} + a_{2\text{-}t} z^{-2}},$$

wherein $\sigma_c$ is a characteristic sensitivity of the low frequency shelving and notch filter, $b_{1\text{-}c}$ and $b_{2\text{-}c}$ are feedforward coefficients defining target zero locations, and $a_{1\text{-}t}$ and $a_{2\text{-}t}$ are feedback coefficients defining target pole locations.

4. The method of claim 3, wherein said parameter signal comprises said characteristic sensitivity $\sigma_c$ and said feedback coefficients $a_{1\text{-}t}$ and $a_{2\text{-}t}$.

5. The method of claim 1, further comprising:

generating said output signal by the low frequency shelving and notch filter.

6. The method of claim 5, further comprising:

providing the output signal to said electro-acoustical transducer.

7. The method of claim 6, wherein the output signal is amplified using a power amplifier prior to providing said output signal to said electro-acoustical transducer.

8. The method of claim 1, wherein the displacement prediction signal is provided to a peak detector of the parameter calculator.

9. The method of claim 8, wherein after the generating the displacement prediction signal, the method further comprises:

generating a peak displacement prediction signal by the peak detector and providing said peak displacement prediction signal to a shelving frequency calculator of the parameter calculator.

10. The method of claim 9, further comprising:

generating a shelving frequency signal by the shelving frequency calculator based on a predetermined criterion and providing said shelving frequency signal to a sensitivity and coefficient calculator of the parameter calculator for generating, based on said shelving frequency signal, the parameter signal.

11. The method of claim 1, wherein the input electro-acoustical signal is a digital signal.

12. The method of claim 1, wherein said low frequency shelving and notch filter is a second order filter with an s-domain transfer function given by $$H_c(s) = \frac{s^2 + s\omega_c / Q_c + \omega_c^2}{s^2 + s\omega_t / Q_t + \omega_t^2},$$

wherein $Q_c$ is a coefficient corresponding to a Q-factor of the electro-acoustical transducer, $\omega_c$ is a resonance frequency of the electro-acoustical transducer mounted in an enclosure, $Q_t$ is a coefficient corresponding to a target equalized Q-factor, $\omega_t$ is a target equalized cut-off frequency.

13. The method of claim 12, wherein $Q_c = 1/\sqrt{2}$, when the electro-acoustical transducer is critically damped.

14. The method of claim 12, wherein $Q_c$ is a finite number larger than $1/\sqrt{2}$, when the electro-acoustical transducer is under-damped.

15. A computer program product comprising: a computer readable medium embodying computer program code thereon for execution by a computer processor with said computer program code, wherein said computer program code comprises instructions for performing the steps method of claim 1.

16. A signal processor, comprising:

a low frequency shelving and notch filter, responsive to an input electro-acoustical signal and to a parameter signal, configured to provide an output signal to a loudspeaker for limiting a vibration displacement of an electro-acoustical transducer;

a displacement predictor block, responsive to said input electro-acoustical signal, configured to provide a displacement prediction signal; and a parameter calculator, responsive to said displacement prediction signal, configured to provide the parameter signal determined using a shelving frequency required for providing said limiting of said vibration displacement.

17. The signal processor of claim 16, wherein the parameter calculator block comprises:

a peak detector, responsive to the displacement prediction signal, configured to provide a peak displacement prediction signal;

a shelving frequency calculator, responsive to the peak displacement prediction signal, configured to provide a shelving frequency signal; and a sensitivity and coefficient calculator, responsive to said shelving frequency signal, configured to provide the parameter signal.

18. The signal processor of claim 16, wherein said low frequency shelving and notch filter is a second order digital filter with a z-domain transfer function given by $$H_c(z) = \sigma_c \frac{1 + b_{1 \cdot c} z^{-1} + b_{2 \cdot c} z^{-2}}{1 + a_{1 \cdot t} z^{-1} + a_{2 \cdot t} z^{-2}},$$

wherein $\sigma_c$ is a characteristic sensitivity of the low frequency shelving and notch filter, $b_{1 \cdot c}$ and $b_{2 \cdot c}$ are feedforward coefficients defining target zero locations, and $a_{1 \cdot t}$ and $a_{2 \cdot t}$ are feedback coefficients defining target pole locations.

19. The signal processor of claim 18, wherein said parameter signal includes said characteristic sensitivity $\sigma_c$ and said feedback coefficients $a_{1 \cdot t}$ and $a_{2 \cdot t}$.

20. The signal processor of claim 16, wherein the output signal is provided to said electro-acoustical transducer or said the output signal is amplified using a power amplifier prior to providing said output signal to said electro-acoustical transducer.

21. The signal processor of claim 16, wherein the input electro-acoustical signal is a digital signal.

22. The signal processor of claim 16, wherein said low frequency shelving and notch filter is a second order filter with an s-domain transfer function given by $$H_c(s) = \frac{s^2 + s\omega_c / Q_c + \omega_c^2}{s^2 + s\omega_t / Q_t + \omega_t^2},$$

wherein $Q_c$ is a coefficient corresponding to a Q-factor of the electro-acoustical transducer, $\omega_c$ is a resonance frequency of the electro-acoustical transducer mounted in an enclosure, $Q_t$ is a coefficient corresponding to a target equalized Q-factor, $\omega_t$ is a target equalized cut-off frequency.

23. The signal processor of claim 22, wherein $Q_c=1/\sqrt{2}$, when the electro-acoustical transducer is critically damped.

24. The signal processor of claim 22, wherein $Q_c$ is a finite number larger than $1/\sqrt{2}$, when the electro-acoustical transducer is under-damped.

25. The signal processor of claim 16, wherein said electro-acoustical transducer is a loudspeaker.

26. A signal processor, comprising:

means for filtering, responsive to an input electro-acoustical signal and to a parameter signal, for providing an output signal to a loudspeaker for limiting a vibration displacement of an electro-acoustical transducer;

means for predicting, responsive to said input electro-acoustical signal, for providing a displacement prediction signal; and means for calculating, responsive to said displacement prediction signal, for providing the parameter signal determined using a shelving frequency required for providing said limiting of said vibration displacement.

27. The signal processor of claim 26, wherein said means for filtering is a low frequency shelving and notch filter, said means for predicting is a displacement predictor block, and said means for calculating is a parameter calculator.

28. An apparatus, comprising;

an electro-acoustical transducer; and a signal processor, comprising:

a low frequency shelving and notch filter, responsive to an input electro-acoustical signal and to a parameter signal, configured to provide an output signal to loudspeaker for limiting a vibration displacement of said electro-acoustical transducer;

a displacement predictor block, responsive to said input electro-acoustical signal, configured to provide a displacement prediction signal; and a parameter calculator, responsive to said displacement prediction signal, configured to provide the parameter signal determined using a shelving frequency required for providing said limiting of said vibration displacement.

29. The apparatus of claim 28, further comprising:

a power amplifier, configured to amplify said output signal prior to providing to said electro-acoustical transducer.

30. The apparatus of claim 28, wherein said electro-acoustical transducer is a loudspeaker.

* * * * *

UNITED STATES PATENT AND TRADEMARK OFFICE

CERTIFICATE OF CORRECTION

PATENT NO. : 7,372,966 B2
APPLICATION NO. : 10/804858
DATED : May 13, 2008
INVENTOR(S) : Andrew Bright It is certified that error appears in the above-identified patent and that said Letters Patent is hereby corrected as shown below:

In column 14, line 2, claim 7, line 2 after "providing" --to-- should be inserted.
In column 14, line 47, claim 15, "steps" should be deleted.
In column 15, line 25, claim 20, after "transducer" --directly-- should be inserted.
In column 15, line 26, claim 20, "the" should be deleted.
In column 15, line 27, claim 20, "said output signal" should be deleted.
In column 16, line 28, claim 28, after "to" --a-- should be inserted.

Signed and Sealed this

Eighteenth Day of November, 2008

Jon W. Dudas

JON W. DUDAS
*Director of the United States Patent and Trademark Office*